United States Patent [19]

Stealy

[11] Patent Number: 4,634,072
[45] Date of Patent: Jan. 6, 1987

[54] ELECTRIC FISHING REEL

[76] Inventor: Arthur J. Stealy, 2100 W. 100th Ave., Denver, Colo. 80221

[21] Appl. No.: 710,215

[22] Filed: Mar. 11, 1985

[51] Int. Cl.$^4$ ............................................. A01K 89/012
[52] U.S. Cl. ..................... 242/84.1 A; 43/21; 242/84.1 M; 250/560; 250/561
[58] Field of Search ...................... 242/84.1 A, 84.1 R, 242/106, 84.1 M; 43/21; 250/559, 560, 561

[56] References Cited

U.S. PATENT DOCUMENTS

| | | | |
|---|---|---|---|
| 3,248,819 | 5/1966 | Stealy | 242/84.1 A |
| 3,437,282 | 4/1969 | Honkonen et al. | 242/84.1 A |
| 4,376,350 | 3/1983 | Bednarz et al. | 242/106 |
| 4,515,479 | 5/1985 | Pryor | 250/561 |

OTHER PUBLICATIONS

The Washington Times Magazine, "Anglers Use High Tech for Fishing", p. 3M, Oct. 15, 1984.

Primary Examiner—Billy S. Taylor
Attorney, Agent, or Firm—Horace B. Van Valkenburgh

[57] ABSTRACT

A fishing reel having a drive motor, gearing, stationary spool for the fishing line and a flanged winding cup provided with a guide for a pickup pin extendable through the flange, together with a cam for causing the guide and pickup pin to be extended, includes a spring which moves the winding cup toward the cam and produces sufficient force to maintain the guide on the cam against a surge of a fish when the pickup pin is extended to use the gearing and unactuated drive motor as a brake. An optical fiber, terminating adjacent the winding cup flange, transmits an impression of the line moving in front of its end around the winding flange during casting or the pickup pin similarly moving, to a translation device which converts the number of rotations into feet, meters, or the like. Such movement is correlated with the amount of line moved onto or off the spool to compensate for differing diameters of a line loop so wound or unwound. A series of solar cells are mounted on the top of the reel housing or form a portion thereof for producing current to charge the batteries, through a diode which permits flow of current one way only. A variable resistance switch for starting the motor not only regulates the speed and power of the motor for playing a fish but also facilitates causing the motor to turn very slightly in order to cause the pickup guide to climb the cam when, after casting, the resistance of the unactuated motor and gearing to movement of the line is to be utilized for braking purposes.

10 Claims, 13 Drawing Figures

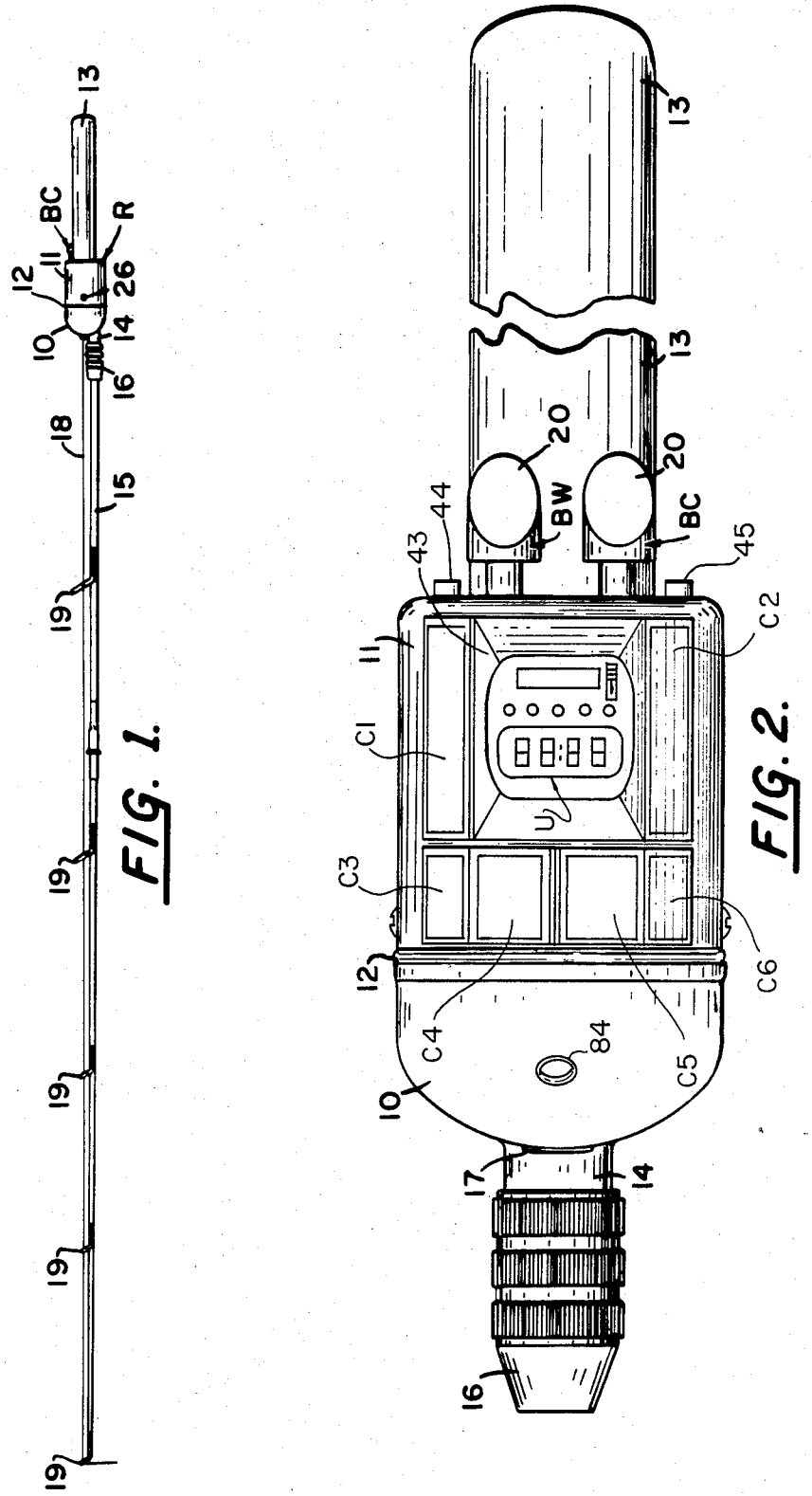

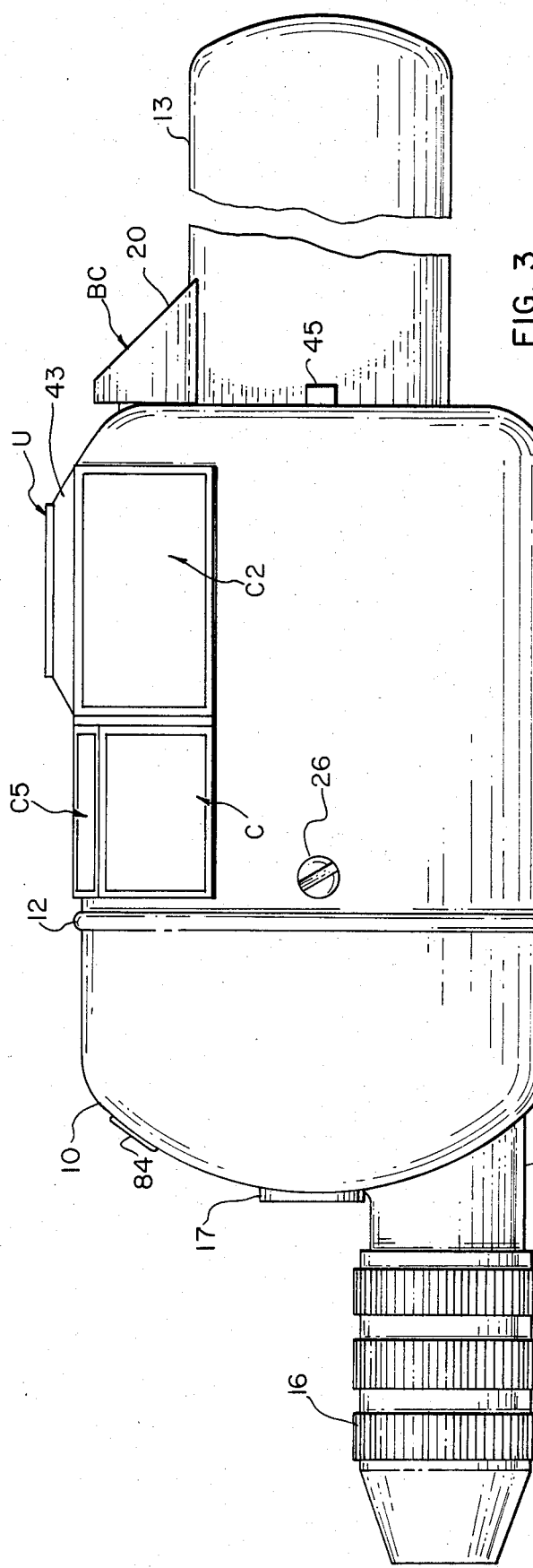
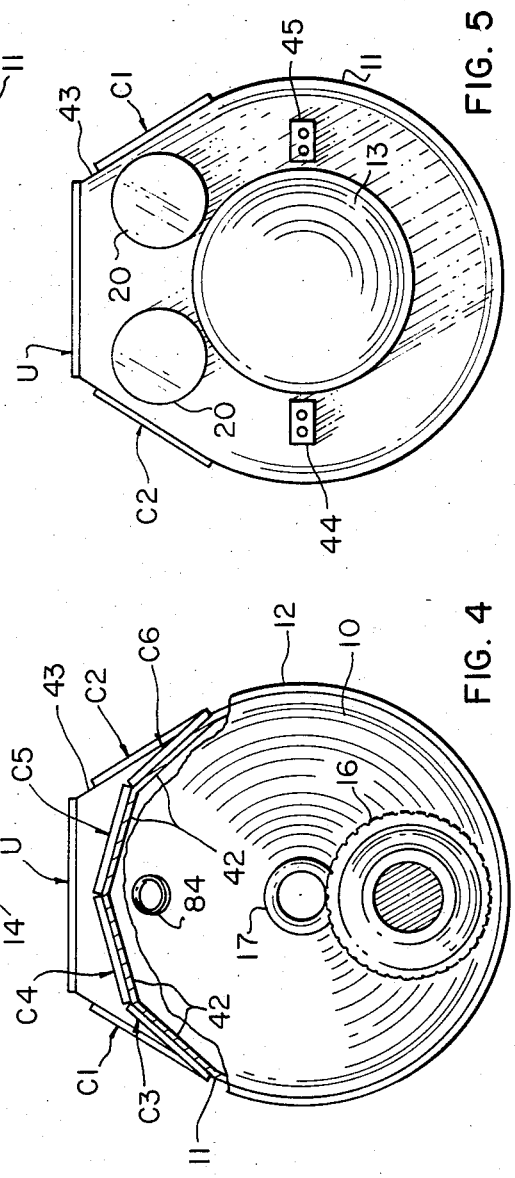

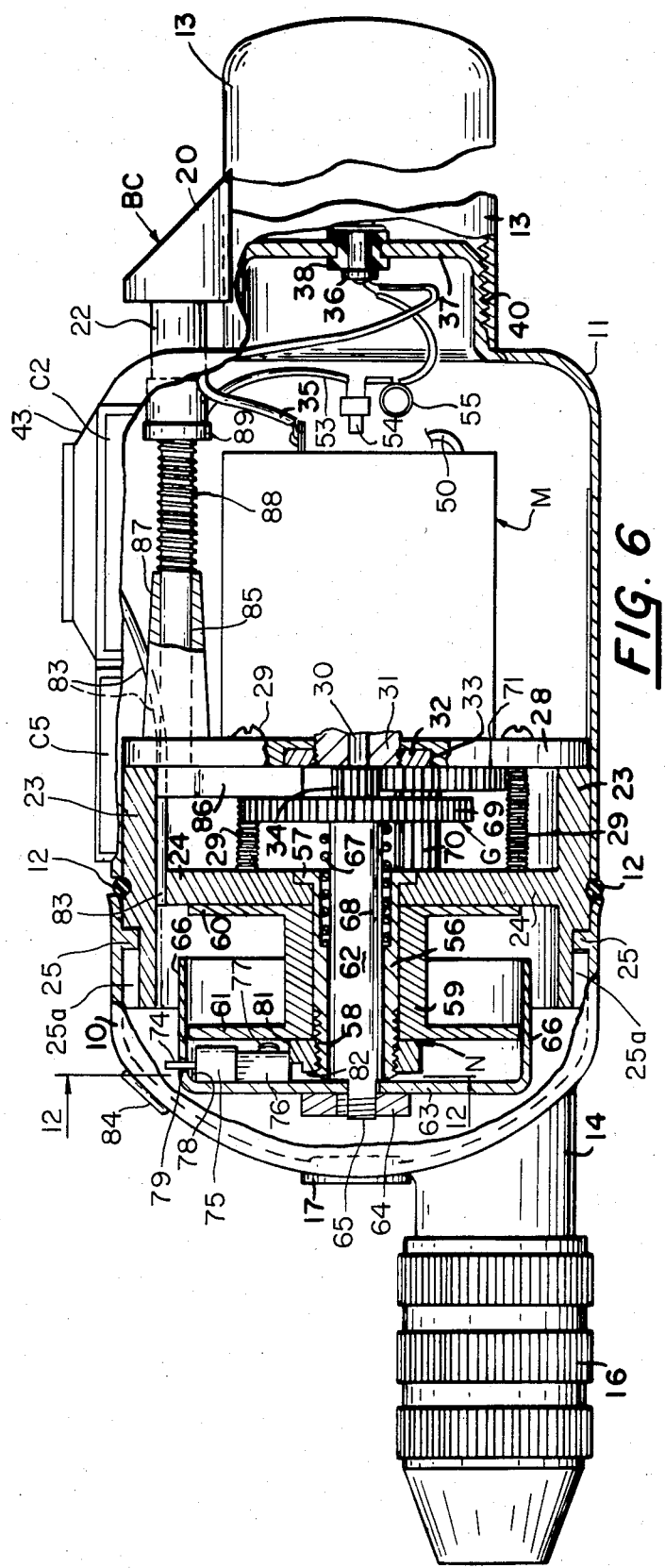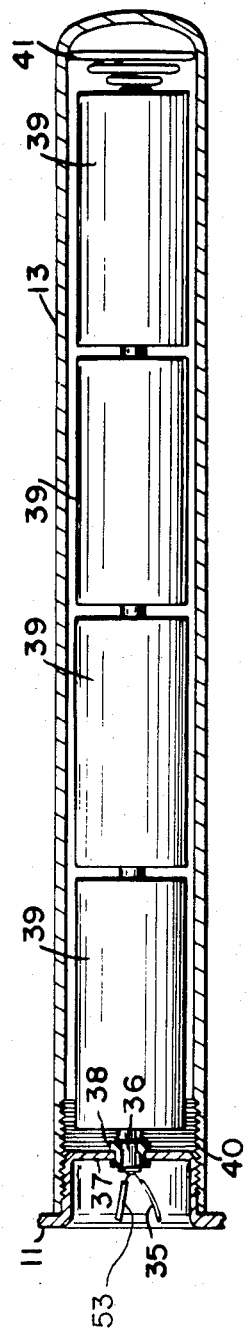

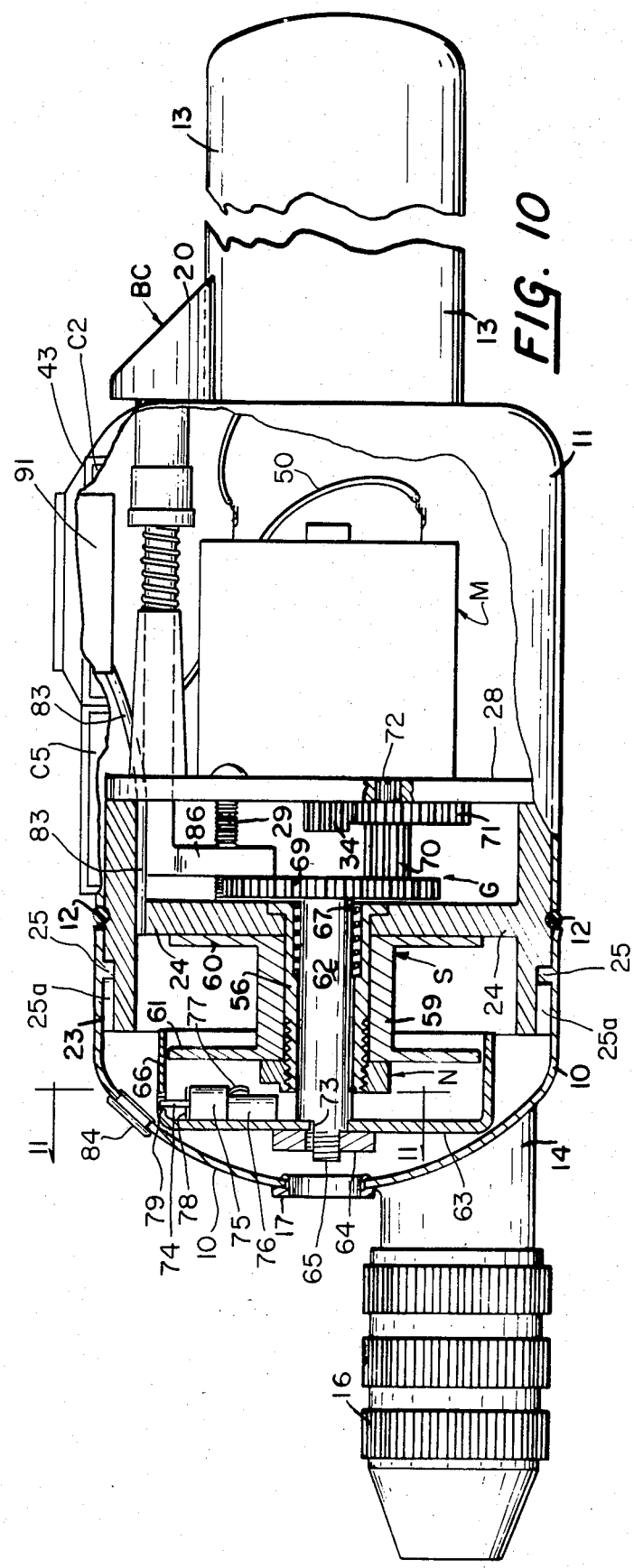
FIG. 10
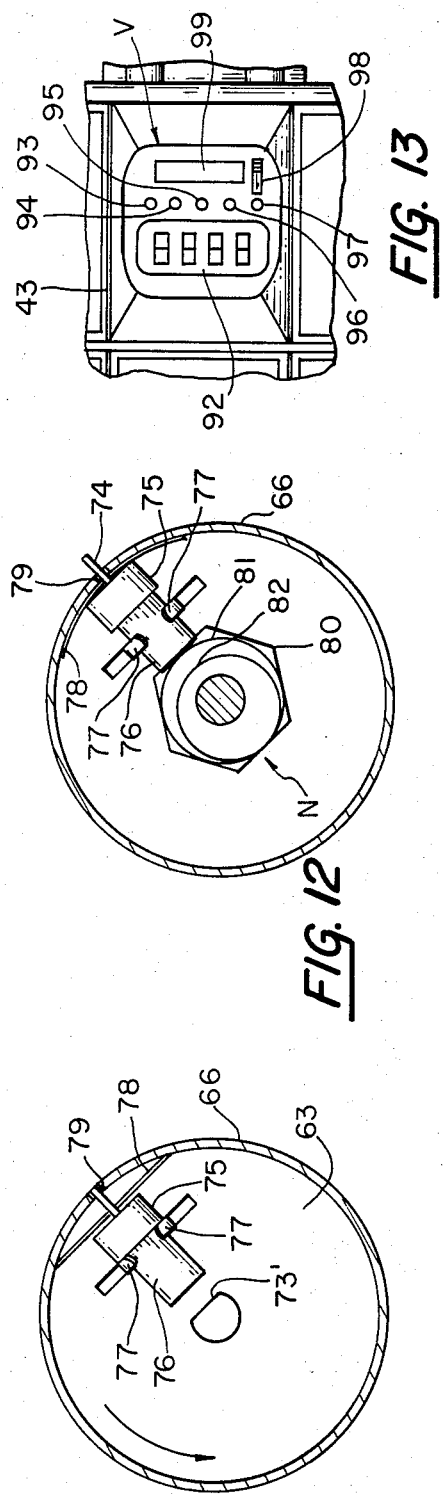
FIG. 13
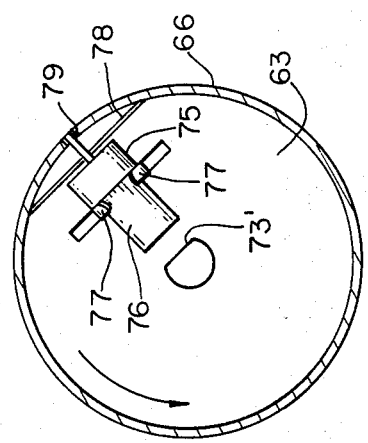
FIG. 12
FIG. 11

ELECTRIC FISHING REEL

This invention relates to a fishing reel and, more particularly, to a fishing reel driven by an electric motor.

BACKGROUND OF THE INVENTION

This invention is an improvement on the motor operated spinning reel of U.S. Pat. No. 3,248,819, which discloses a spinning reel driven by an electric motor, in turn supplied with current by a series of batteries. There is a casting button which is pushed forwardly to move a winding cup forwardly from a spool, so that a pickup finger will no longer extend beyond a winding cup flange, and, for casting purposes, a winding button which is pushed forwardly to cause the winding cup and extended pin to rotate about the spool for winding purposes. When the winding disc turns, the pressure of a spring moves the cup back to a position in which the inner end of the winding finger climbs a cam nut and is projected from a flange of the cup to pick up the line and wind it on the stationary spool. After casting, if a fish is hooked, the winding button may be pressed to start the motor until the pin engages the cam and is extended and then released so that the gearing between the drive motor and the winding cup, as well as the motor, will produce a drag on the line. With an appropriate motor, this drag on the line can be utilized in charging the batteries.

Among the objects of this invention are to provide a novel fishing reel; to provide such a fishing reel operated by a motor which is battery powered but is provided with solar cells for use in charging the batteries; to provide such a fishing reel in which a flanged winding cup is normally placed in a position in which the winding pin is extended, except when casting, so that a drag on the line will be produced when the fish starts pulling the line out of the reel, even when the fish produces a jerk which otherwise would pull the winding pin away from the cam; to provide such a fishing reel in which the amount of current for charging the batteries through the solar cells may be controlled; to provide such a fishing reel which may be provided with a computer which may be controlled to indicate the amount of line released or brought in, such as to show the distance to a fish; to provide such a fishing reel in which the amount of line being cast or retrieved may be measured through rotation of the pickup pin when casting or braking, or movement of the line around the winding cup flange when casting or letting the fish run with the line; to provide such a fishing reel which transfers, as to a computer, by fiber optics, an indication of the number of turns of the line moving on or off the spool, so that each time the pickup finger moves past or the line moves around the cup flange, a measurement indication can be produced, from which the amount of line so moving can be indicated; and to provide such a fishing reel which is readily constructed and efficient in operation.

SUMMARY OF THE INVENTION

The fishing reel of the present invention includes a drive motor, a stationary spool on which the fishing line is wound and a winding cup provided with an outwardly movable pickup pin extendable through a flange of the winding disc. The winding disc is mounted on a shaft which is both rotatable and axially movable, being adapted to be rotated by the motor, so that the pickup pin will reel in the line by extension through a hole in the winding cup flange. The shaft and winding cup are movable by a casting button to a position in which the pickup pin is retracted by a leaf spring, while a winding button is adapted to turn the motor on, so that the winding cup may be retracted by a coil spring to a position in which a guide portion of a pickup pin carrier is moved outwardly by a cam nut. One improvement of this invention is an increase in the force produced by the coil spring so that it is able not only to retract the winding cup and cause the pickup pin guide to climb onto the cam nut and project the pickup pin to a line-engaging position upon a short period of rotation of the motor, but also sufficient to prevent a surge of a fish, while being braked by the gearing and unenergized motor, from pulling the winding cup away from the cam nut and causing the pickup pin to be retracted. Another feature is an optical fiber which is placed in a position to receive light transmitted through a transparent window mounted in the reel housing, so that the image produced when the line moves around the winding cup flange in front of the optical fiber, or during casting or play of a fish may be indicated, as well as the periodic appearance of the pickup pin when the gearing and unenergized motor are used as a brake. An indication, as in feet or meters, of the length of line moving off or on the spool, may be projected by a computer readout, on the basis of the number of revolutions of either the line or the pickup pin moving around the winding cup flange. A similar readout may be obtained while the line is being reeled in, with the appearance of the pickup pin in the image being transmitted through the optical fiber to the computer. An additional feature is the charging of the batteries utilized to actuate the motor by solar cells which produce a voltage slightly higher than the voltage produced by the batteries when supplying current to the motor, in a charging wire from the solar cells.

THE DRAWINGS

FIG. 1 is a side elevation of an automatic fishing reel of this invention, with a fishing pole mounted thereon.

FIG. 2 is an enlarged, condensed top plan view of the automatic fishing reel of FIG. 1.

FIG. 3 is a further enlarged, condensed side elevation of the fishing reel of FIG. 1.

FIG. 4 is a front view, on a slightly reduced scale with respect to FIG. 3, of the fishing reel.

FIG. 5 is a rear view, also on a slightly reduced scale with respect to FIG. 3, of the fishing reel.

FIG. 6 is a condensed side elevation of the fishing reel, on a scale similar to FIG. 3 but with certain parts thereof broken away and other parts in longitudinal section to show the same more clearly, the parts being in a position in which a pickup pin is in an extended, line-engaging position.

FIG. 7 is a longitudinal section on a scale similar to FIG. 3, of a combined battery case and handle of the reel.

FIG. 10 is a condensed side elevation similar to FIG. 6, but showing the pickup pin in retracted position.

FIG. 11 is a fragmentary, transverse vertical section taken along line 11—11 of FIG. 10, showing the pickup pin in retracted position.

FIG. 12 is a fragmentary, transverse vertical section taken along line 12—12 of FIG. 6, showing the pickup pin in extended position.

FIG. 13 is a fragmentary enlargement of a computer control section of the fishing reel, shown in FIG. 2.

DESCRIPTION OF THE PREFERRED EMBODIMENT

Figure 8:
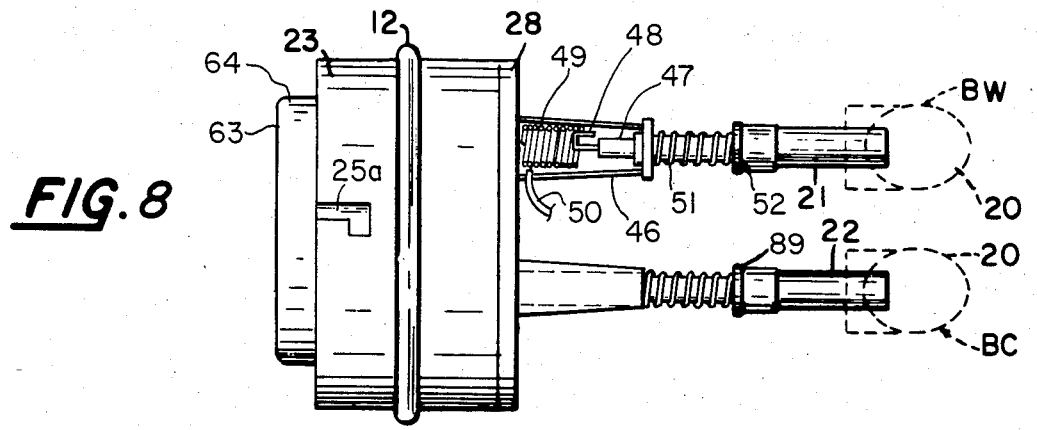
FIG. 8 is an enlarged top plan view, on a scale similar to FIG. 2, of certain parts of the fishing reel within a pair of housings, the housings being omitted for clarity of illustration.

An automatic fishing reel R of this invention, as shown in FIG. 1, is provided with a front spool housing 10 and a rear motor housing 11, separated by an O-ring 12 which prevents moisture from entering the fishing reel, particularly to a motor M and gear train G of FIG. 6, which are described in greater detail below. Conveniently, a handle 13, which also serves as a battery case as described below, is attached to the rear end of motor housing 11. The O-ring 12 also acts as a shock absorber for the whip of the rod during casting, to reduce the shock transmitted to the handle. A conventional, longitudinally slotted, fishing pole socket 14 extends forwardly from the lower front end of spool housing 10 and may be attached thereto, as by welding, so that a fishing pole, such as fishing pole 15 of FIG. 1, may be held in place by a ferrule 16 threadably received on socket 14. Conveniently, a central opening is provided in the front end of spool housing 10 above socket 14, at which is attached a collar 17, as in FIGS. 4 and 10, through which a fishing line 18 may move from a stationary spool within the housing, the fishing line extending through a plurality of eyes 19 spaced along the fishing pole, as in FIG. 1.

The handle 13 is adapted to be grasped by one hand of the user, for manipulation of the pole, the fingers being curled around the handle to place the thumb in position to push forwardly either a casting button BC of FIG. 2 or a winding button BW for casting and winding, respectively. Since the only manipulation necessary to shift from casting to winding position is a shift of the thumb from button BC to button BW, no complicated coordination of movement is necessary, so that the possibility of losing a fish through having to find and start turning a reel handle is avoided. Each button BC and BW is conveniently provided with a diagonal rear surface 20 to facilitate forward pressure of the thumb on the respective button, although a convex surface may be used. Button BW is mounted on a stem 21 which extends through an appropriately located hole in the upper rear of housing 11, while button BC is mounted on a similar stem 22. The parts with which buttons BW and BC cooperate are described below, each button being urged rearwardly by a spring, described later, which causes the button to move back to its rear position as soon as forward pressure thereon is released.

The reel also includes a series of solar cells $C_1$ and $C_2$, of larger size, mounted on opposite sides of a microcomputer control U, rearly on housing 11 as well as a series of solar cells $C_3$, $C_4$, $C_5$ and $C_6$, of smaller size and mounted on the forward portion of housing 11. The solar cells $C_1$ and $C_2$ may be of a type produced by G. C. Electronics of Rockford, Ill. and identified as part No. J4803, while solar cells $C_3$ through $C_6$ may be of a type also produced by G. C. Electronics and identified as part No. J4800. The former produce 1.5 volts and 120 milli amps., while the latter produce 0.5 volts and 50 to 60 milli amps. Solar cells $C_1$ and $C_2$ may be connected in series and solar cells $C_3$ and $C_6$ may be connected in series and in series with solar cells $C_1$ and $C_2$.

Both the spool housing 10 and the motor housing 11 are connected to a cylinder 23 which has a central, circular, shaft-supporting rib 24, as in FIG. 6. Spool housing 10 is removably attached to cylinder 23 by a pair of opposed, depending pins 25, as in FIGS. 6 and 10, and each pin 25 may engage a bayonet slot or groove 25a, the longitudinal portion of each of which is shown in FIGS. 6 and 8 and the transverse portion in FIG. 8. Motor housing 11 may be attached to cylinder 23 by means of screws offset circumferentially from pins 25, such as screws 26 of FIGS. 1 and 3. Advantageously, the O-ring 12 is received in a central peripheral groove 27 of cylinder 23, as shown more clearly in FIG. 9, so that the edges of spool housing 10 and motor housing 11 abut the O-ring to form a tight seal.

Within the fishing reel are two main components, a spool assembly S, located forwardly of rib 24, and a motor M, located rearwardly of rib 24. The motor M is mounted on a circular mounting plate 28, which is attached to the inner end of cylinder 23 by means of a plurality of circumferentially spaced screws 29, as in FIGS. 6 and 10. Motor M is provided with a drive shaft 30 which extends through a mounting sleeve 31, at the front end of the motor, as in FIG. 6, the sleeve being held in position by a nut 32 which is received in a bore 33 in plate 28 and threadably received on the end of sleeve 31. A pinion 34 is mounted on the front side of plate 28, on the end of motor shaft 30, which also extends through plate 28, for driving the gear train G, as described below.

An electrical wire 35 extends from motor M and is soldered to a battery contact 36, extending through a rear cylindrical extension 37 of housing 11 and held in position by a bushing 38, conveniently formed of plastic or rubber. The motor is conveniently a 2 to 12 volt motor powered by four dry cells 39, which are arranged in series within the combined handle and battery case 13, as in FIG. 7. The batteries 39 may be conventional 1½ volt dry cells, although it is preferable to use rechargable Ni-Cd cells, which will deliver 1.25 volts each to make a total of 5 volts. This is an advantage when the solar cells $C_1$ and $C_2$ each produce 1.5 volts and solar cells $C_3$–$C_6$ each produces 0.5 volts, since then the total voltage of the solar cells, in series, will be 5.0 volts, the same as the voltage of the batteries. The outside of cylindrical extension 37 is provided with threads cooperating with threads 40 on the inside of the front end of battery case and handle 13, for attachment to the latter, while a conventional spring 41 is provided within the rear end of handle 13, to urge the batteries against contact 36. If desired, each end of handle 39 may be internally threaded and a threaded cap carrying spring 41 may be attached at the rear end of the handle, so as to permit, if desired, a similar handle to be connected as an extension and connected to the first handle by a threaded sleeve. This will permit the number of batteries 39 in the handle to be doubled, so that current of double the voltage may be supplied to motor M.

As will be evident, the weight of batteries 39 in the elongated handle 13 may more than offset the weight of motor M, gear train G and spool assembly S, so that the center of gravity of the reel will be at a point on handle 13. Thus, the reel feels balanced to the user and can be held and shifted, as necessary, without undue physical strain. For this purpose, as many of the parts, such as housings 10 and 11, cylinder 23, plate 28 and the parts of spool assembly S, are made as light as possible, such as being formed of aluminum, except where steel or other material is necessary for wear or other purposes.

The motor housing 11 is generally cylindrical, except for angular sections 42 on which the solar cells $C_3$ through $C_6$ are mounted, as in FIG. 4, and a frustro-pyramidal section 43 of FIGS. 2–5, in which the computer control U fits above the computer and on the sides of which the solar cells $C_1$ and $C_2$ are mounted. Computer control U is mounted in a position within and below a rim around the top of section 43, as shown in FIGS. 2 and 13, to protect the parts described later. If desired, the housing 11 may terminate at the edges of cells $C_1$ and $C_2$, as well as cells $C_3$ to $C_6$, with the angular sections 42 being molded of plastic and integral with or attachable to frustro-pyramidal section 43, which receives the computer and its control U, as well as cells $C_1$ and $C_2$. Provision may be made to provide the computer and solar cells $C_1$, $C_2$ and $C_3$–$C_6$ as a unit which may be snapped into the motor housing, using an H-shaped gasket extending around the edge of the unit for sealing purposes.

As in FIGS. 2, 3 and 5, a jack 44 is placed at one side of the rear of housing 11 for receiving a plug which receives from an outside source, such as a 12 volt battery of an engine driven boat, current to operate motor M at a faster speed and with greater power, for which motor M may be specially wound to receive. At the other side of the housing 11, a jack 45 is placed to receive a plug for charging batteries 39, from an outside source, such as a battery charger.

The other side of the circuit of motor M includes spring 41, handle 13, motor housing 11 and plate 28 to which is connected a support 46. A rod 47 of FIG. 8, which is an extension of stem 21, carries a resilient contact 48 adapted to engage a ceramic encased, variable resistance coil 49, whose turns are bare along the path of contact 48. The resistance of the coil will decrease as the button 20 and stem 21 are pushed inwardly, so that the speed and/or pull of the motor M will be increased as the button is pushed further inwardly. The resistance 49 may be a coil type, as shown, or a carbon ring or other type adapted to provide a maximum resistance upon first contact but a lesser resistance as the switch contact moves further inwardly. The inner end of variable resistance 49 is connected by a wire 50 to motor M. Rod 47 is surrounded by a spring 51 which extends between support 46 and a collar 52 which is mounted on stem 21.

Button BW is conveniently secured to the rear end of stem 21, as in FIG. 8, while button BC may be similarly secured to the rear end of stem 22. Thus, when button BW is pressed forwardly, switch contact 48 will engage variable resistance 49 and the circuit will be completed to motor M, the speed of motor M depending on the extent of forward movement of button BW. A slight push will start the motor slowly, the advantage of which, in connection with the start of use of the gearing and motor as a brake, will be described later. In any event, when the button BW is released, spring 51 will return the button to its initial position and the motor M will stop. A wire 53 of FIG. 6, from the solar cells $C_1$ through $C_6$, extends to the battery contact 36, through a diode 54 which permits the current to flow only one way to the batteries. A resistor 55 may optionally be placed in series with diode 54 to reduce the voltage of the current flowing to the batteries when the solar cells produce a higher voltage than the batteries should receive and is particularly desirable in the line from charging jack 45 when a high voltage charger is used. Diode 54 and resistor 55 may, if desired, be installed within the computer below control U.

Figure 9:
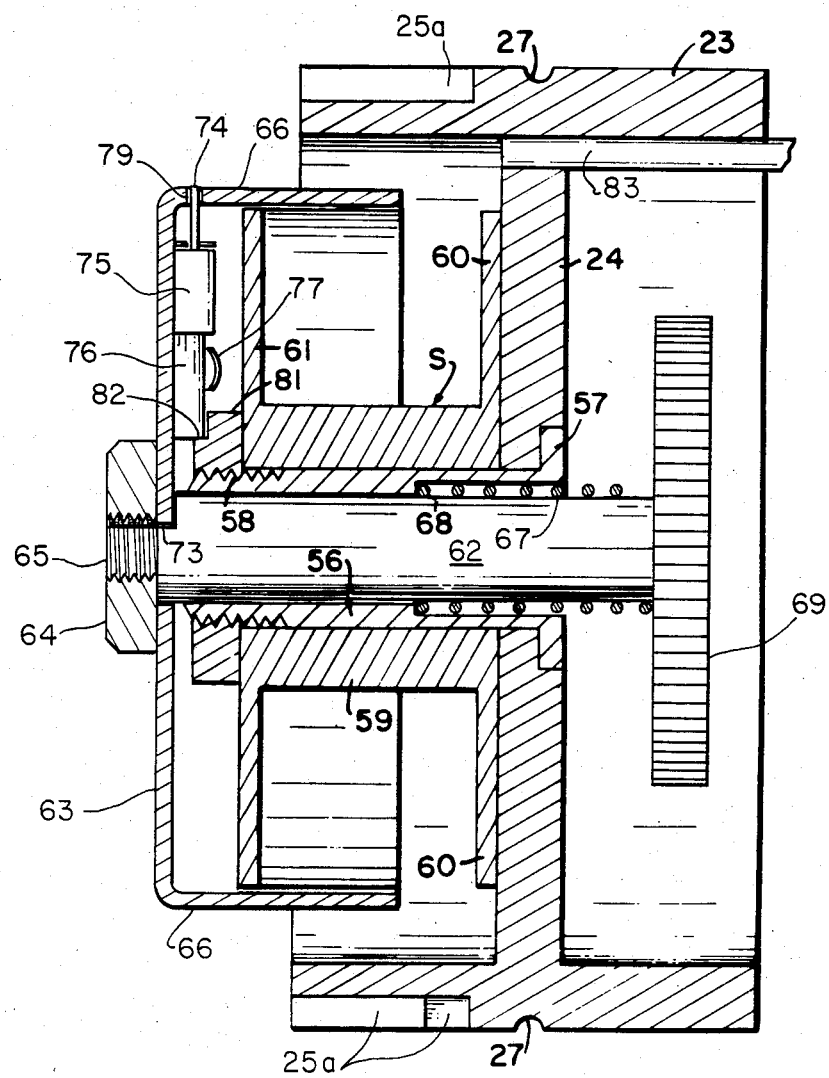
FIG. 9 is a still further enlarged, longitudinal section of a spool assembly of FIG. 6, showing a pickup pin as it is being started to move to a line-engaging, extended position.

The spool assembly S, as in FIGS. 6, 9 and 10, includes a fixed bushing sleeve 56, conveniently made of brass and extending forwardly from rib 24, being provided with a peripheral inner flange 57 received in a recess in the rear side of rib 24 and threads 58 at the outer end. A fixed spool hub 59 is received over sleeve 56 and is held in place by means of a cam nut N, engaging the threads 58. Thus, spool hub 59 is mounted in a stationary position, with an inner flange 60 engaging rib 24 and an outer flange 61 clamped by nut N. A shaft 62 extends from gear train G through bushing 56 and is both rotatable and movable axially in the bushing. A line guiding cup 63 is attached to the outer end of shaft 62, as by a nut 64 engaging a threaded, integral pin 65 extending from shaft 62. Cup 63 is provided with a peripheral flange 66, which extends inwardly over spool flange 61 and a portion of spool hub 59. Shaft 62 is moved forwardly by casting button BC, in a manner to be described, but is normally urged rearwardly by a coil spring 67 extending therearound and received in a counter bore 68 in the inner end of bushing 56, the other end of spring 67 bearing against a gear 69 which is mounted, as by pressing, on the reduced inner end of shaft 62. Since shaft 62 may both rotate within bushing 56 and move longitudinally therein, as indicated, this will result in the same movement of cup 63.

In the gear train G, as in FIGS. 6 and 10, gear 69 is driven by a spline pinion 70, which permits axial movement of gear 60 without disengagement and which is mounted conjointly with a gear 71, as by merely pressing gear 71 and spline pinion 70, on a pin 72, which is journalled at opposite ends in rib 24 and plate 28, as in FIG. 10. It will be noted that pin 72 is spaced to one side and downwardly from both flange 57 and bushing 56 in rib 24, as well as counter bore 33 in plate 28. A bushing is preferably inserted in a hole in each of rib 24 and plate 28, to provide a bearing for the opposite ends of pin 72. Gear 71 is engaged by pinion 34 mounted on motor shaft 30, to cause the gear train to be driven by the motor M and cup 63 to be rotated thereby, at a considerably reduced speed, as by a chord or flat 73 on shaft 62, as in FIG. 9, and a corresponding chord 73' in the hole provided in disc 63 for engagement with shaft 62 and shown in FIG. 11. The speed reduction of gear train G may be on the order of 27 to 1, such as provided by motor pinion 34 having 8 teeth, gear 71 having 36 teeth, spline pinion 70 having 8 teeth and gear 69 having 48 teeth. Since gear 69 thus has a greater diameter than gear 71, motor shaft 30, as in FIG. 10, is conveniently offset slightly from center. Also, gear 69 is conveniently formed of nylon, not only for quietness and wear, but also for a further purpose to be described.

Cup 63 carries a pickup pin 74 mounted in the outer end of a block 75 having a smaller guide section 76 movable radially between a pair of ears 77 struck from cup 63 to partially encircle guide 76, both block 75 and guide 76 being arcuate in cross section, with the flat side of each abutting the inside of cup 63. The outer portion of block 75 will abut ears 77 when moved inwardly by a leaf spring 78, which extends across the block 75 to the underside of flange 66 and which returns the pickup pin 74 to a position in which it does not extend beyond a hole 79 in flange 66, as in FIG. 10. Cam nut N, as indicated, is threaded on the inside for attachment to shaft 56 through engagement with threads 58 and clamps line spool S against rib 24. Cam nut N is provided with a narrow hexagonal portion 80 abutting spool flange 61 for use in tightening the nut on bushing 56 with the major portion of the width of the cam nut being a circular surface 81 on which the inner end of guide section 76 rests during extension of pickup pin 74. Laterally of surface 81, cam nut N is provided with a cam surface 82 which may be merely beveled across the nut or oval in shape, as in FIG. 12. Thus, surface 82 has a minimal extension cleared by the inner end of guide 76 in the position of FIG. 11, but a maximum extension corresponding to surface 81, so that as cam nut N rotates and disc 63 is pressed inwardly by spring 67, the block 75 and pickup pin 74 with it, will be moved outwardly by cam surface 82, as in FIG. 9, until continued pressure of spring 67 causes the inner end of guide 76 to move onto circular surface 81, as in FIG. 6.

When guide 76 of block 75 rides up onto cam nut N, block 75 is moved outwardly against the pressure of leaf spring 78, moving pickup pin 74 outwardly through hole 79 in flange 66, as in FIG. 6. When the pickup pin 74 extends through hole 79, as shown, it will engage the fishing line as it passes from or onto spool 59, over cup flange 66 and through collar 17 to pole 15 and thence to the fish, if caught. When a fish is caught on the line, the gearing G and motor M may be utilized as a drag, by starting the motor M slowly, as by pushing the winding button BW only a short distance, thereby causing the motor to start slowly and, through pressure of spring 67, cause the pickup pin guide 76 to climb up onto cam nut N, thereby causing the pickup pin 74 to extend through a hole 79. The pressure of spring 67 ordinarily maintains the pickup pin in the extended position, even though the motor is not running, so that as the fish pulls the line out of the spool S, the line will, in turn, rotate cup 63 in a reverse direction, thereby placing the resistance of gearing G and motor M against movement of the line and braking the movement of the line off the spool. It may sometimes happen that the fish may relax or move back toward the fisherman and then suddenly lunge away, in which case the force may be sufficient to overcome the force of spring 67, pull the pin guide 75 off the cam nut and thus cause the pickup pin to return to its retracted position. In accordance with this invention and in order to obviate the effect of such a lunge in many instances, the force produced by spring 67 has been increased considerably over the originally designed force, which would normally cause the pickup pin to climb onto the cam nut when the motor M is started. Thus, spring 67 now exerts approximately one and one-half times the force of the previous spring of U.S. Pat. No. 3,248,819. It has been found that this increase in the force produced by spring 67 will counteract most lunges of fish which would otherwise pull the cup 63 in a direction which will cause the pickup pin to be retracted.

A braking effect on the line, as when the line is being pulled out by a fish, may also be produced by pressure on casting button BC, to press the front corner of cup 63 toward the inside of housing 10, while pickup finger 74 is retracted. This will tend to clamp the line between the cup and the housing. The pressure will produce a frictional resistance to movement of the line, which may be sufficient to slow the movement of the fish. To permit this method of braking to be utilized, the window 84 is installed slightly above the corner of cup 63, so that the cup will not pop the window out or the line cut or weakened by the edge of the window.

As described, when shaft 62 is moved inwardly by coil spring 67, the inner end of guide section 76 of block 75 will ride upwardly on cam nut N when rotated to the position of FIG. 9 and pin 74 will thereby engage the line for reeling in, when the motor is continued in operation, or produce a drag on the line when the motor is started only momentarily by a slight push of button BW and turns sufficiently to cause the block carrying the pickup pin 74 to move up onto surface 81 of cam nut N. However, when shaft 62 is moved forwardly for casting, the inner end of block 75 will drop off the cam nut N and pickup pin 74 will be retracted by leaf spring 78 to the position of FIG. 10.

As in FIGS. 6, 9 and 10, rib 24 is provided with a hole and mounting plate 28 with a similar hole, to accommodate an optic fiber 83 which is disposed along the underside of cylinder 23 and extends to computer C, in order to transmit the image of the line passing from the spool assembly around flange 66 of cup 63, or the movement of pickup pin 74 past a position in front of the optic fiber 83. This information may be transmitted to the computer and there utilized in producing a reading on an indicator, referred to later, which shows the amount of line which has been played out, as in terms of number of feet of line played out, which may be a multiple of the number of revolutions of the line moving around flange 66 in front of optic fiber 83 or the corresponding movement of pickup pin 74. Similarly, the computer may be programmed to indicate the number of feet of line pulled in, during reeling. In order to illuminate the area in front of optic fiber 83, illumination means is provided, such as a convex, clear plastic window 84 may be mounted in the spool housing 10, as in FIGS. 2-4, 6 and 10. As in FIG. 10, the window 84 corresponds in curvature to the housing 10 and may be provided with a groove around its periphery, as shown, for snapping into a corresponding hole in the housing. As will be evident, light passing through window 84 will illuminate the area in front of optic fiber 83 and thereby permit the optic fiber to successfully transmit an indication of the reoccurring image of the line passing in front of the window, as during casting, or the pickup pin 74 passing in front of the window when the line is reeled in or when the pickup finger is extended, so as to utilize the gearing and motor as a brake while the fish is running with the line after being caught.

When it is desired to cast, with motor M stopped, it is necessary that shaft 62 be moved forwardly so that pin 74 will be retracted. This is accomplished by the fisherman pressing forwardly on casting finger button BC, as indicated previously. Stem 22 of button BC is attached to or integral with a bar 85, preferably generally rectangular in cross section to prevent twisting and extending through rectangular holes in each of a support 87 and plate 28, to which support 87 is attached. Bar 85, at its front end as in FIGS. 6 and 10, is provided with a preferably integral, downwardly extending arm 86 which is adapted to abut gear 69 to move gear 69 forwardly so as to move shaft 62 and cup 63 along with it, when button BC is pressed. By making gear 69 of nylon, wear due to friction is reduced, since arm 86 remains stationary and during rotation of gear 69, spring 67 will press gear 69 against arm 86. To return button BC to its initial position when pressure thereon is released, a coil spring 88 surrounds bar 85, one end of the spring bearing against the rear surface of support 87 and the other end bearing against a collar 89 on stem 22. Thus, when button BC is pushed forwardly, arm 86 will move gear 69 forwardly, forcing shaft 62 forwardly so that cup 63 is also moved forwardly, causing pickup finger 74 to clear nut N, so that leaf spring 77 will move pickup finger 74 inwardly through hole 79 and the pickup finger can no longer engage the fishing line 18. Thus, in this position, the fishing line is free to be pulled off the reel by the usual casting operation.

To wind the fishing line 18, it is merely necessary to release button BC and press button Bw to complete the circuit to motor M. This will cause cup 63 to rotate, as explained above, and will permit coil spring 67 to move shaft 62 rearwardly, along with cup 63 and pickup pin 74. As explained previously, this will cause guide 76 to ride up onto the circular surface 81 of nut N, thereby extending the pickup pin through hole 79, as in FIG. 6, so that the pickup pin 74 will engage the fishing line 18 and wind it onto stationary spool hub 59. When the line is wound on the spool to the desired extent, the motor may be stopped by releasing button BW and the fish, if still on the hook, captured.

The computer control U, as in FIG. 13, may be mounted below the rim of frustro-pyramidal section 43 of spool housing 11, as indicated, so as to protect the various buttons, switches and the like of the computer control, while a computer 91 is placed below the controls, as in FIG. 10. Computer control U includes a liquid crystal display or L.C.D. readout panel 92, the signals of which are adapted to display the numerical figures showing the amount of line which has moved from or onto the spool S during the period that the computer has been actuated by signals transmitted through the optical fiber 83. The control panel may further include a series of push buttons for particular purposes, including a push button 93 for actuating the light footage measurement readout. In addition, push buttons for setting a conventional digital watch (not shown) may include push button 94 for setting the hour reading of the watch, a push button 95 for setting the minute reading of the watch and push button 96 for setting the date indicated on the watch.

Another push button 97 is adapted to turn on and off a conventional light (not shown) similar to those utilized with digital watches. Such a light is placed to illuminate the computer control panel while night fishing. A switch 98 is moved between on and off positions for producing a display of the condition of the batteries, such as the voltage available for driving the motor M, which condition is visible in a window 99.

In order to be able to instruct the computer 91 to produce more accurate readout of the line footage on readout panel 92, it is desirable to first instruct the computer to display on readout 92 the number of turns which the pin 75 makes or the number of times the line passes around in front of the optic fiber 83, then pull out a predetermined amount of line, such as 40 or 50 feet, and record the number of turns required for that amount of line. Then the operation is repeated for successive sections until all of the line has been pulled off the spool S, with a record being made of the number of turns for each specific length of line selected, while the same operation may be repeated for reeling the line in. It is desirable to rewind the line on another spool, such as spaced the specific distance from the reel, so as to simplify measuring the amount of line making up the predetermined length. For a spool whose hub 59 is one inch in diameter, three inches of line from a coil directly on the hub will be unwound for each revolution around the spool, but from a coil 0.5 in. further out at a diameter of two inches, over six inches will be unwound for each revolution around the spool. If any difference between the number of turns required to play out different sections when the entire line has been played out or reeled in, the difference between the number of turns required to produce a particular length of line may then be incorporated in the instructions to the computer, so that the indication of footage on the readout panel 92 will be more accurate. Otherwise, as soon as it has been established that a certain number of turns will produce a certain length of line played out or reeled in, the computer may be instructed accordingly, so that each turn of the pin 74 around the reel or each passage of line around the reel will result in the corresponding footage being indicated by the computer.

Although a preferred embodiment of this invention has been indicated or described and certain variations shown or indicated, it will be understood that various other changes and variations may be made without departing from the spirit and scope of this invention.

What is claimed is:

1. A fishing reel comprising:
 a housing enclosing a motor;
 a spool on which a fishing line may be wound or unwound for movement through an aperture in said housing;
 a winding cup carrying means for engaging said line for winding onto said spool;
 means driven by said motor for rotating said winding cup;
 battery means including at least one battery for supplying current to said motor;
 a plurality of solar cells of different production capacities for producing electrical current upon exposure to sunlight;
 means for mounting said cells in an exterior position on the top and sides of said reel; and
 means connecting said cells with said batteries for charging said batteries.

2. A fishing reel as defined in claim 1, including:
 a diode for limiting the voltage of the current supplied to said batteries from said cell means; and
 the voltage capacity of said cell means at least equaling the normal voltage output of said batteries.

3. A fishing reel as defined in claim 2, including:
 a resistor connected in series between said diode and said battery means.

4. A fishing reel as defined in claim 1 including:
 means connecting said solar cells of different production capacities in series.

5. A fishing reel as defined in claim 1, wherein:
 said reel includes a computer mounted centrally on the top of said reel;
 a pair of solar cells of greater production capacity at each side of said computer and extending downwardly; and
 a series of solar cells of lesser production capacity mounted in angular relation forwardly of said computer and extending downwardly along each side of said reel.

6. A fishing reel comprising:
 a spool on which a line may be wound and from which said line may be unwound;
 a line winding cup having an annular flange extending toward and around one end of said spool;

means for rotating said cup about essentially the same axis as said spool;

means for moving said cup toward and away from said spool;

pickup means mounted on said cup and having a portion alternatively extending outwardly through said flange but engageable with a line passing around said flange to or from said spool;

means for extending said pickup means outwardly beyond said flange when said cup closely approaches said spool;

means providing illumination for said pin in extended position and said line as it passes off said spool;

optic fiber means in operative position with respect to said illumination means and having an end adjacent said spool in a position opposite said cup and adapted to receive an image of said pin in extended position as it rotates around said spool and also to receive an image of the line moving in front of said optic fiber means when said line is moving off said spool, as during casting; and means for receiving said optical indications of the presence of said pickup means and/or said line.

7. A fishing reel as defined in claim 6, including:

a housing enclosing said spool and said winding cup; and a transparent window in said housing adjacent the portion of said cup directly opposite the end of said optic fiber means.

8. A fishing reel as defined in claim 6, including:

means for displaying the length of line unwound from or wound onto said spool, as a multiple of the number of turns of said rotating line-engaging means while extending from said flange of said cup or said line as it passes around said winding flange in moving off said spool.

9. A fishing reel as defined in claim 7, wherein:

said spool is mounted on a bushing extending from a transverse rib within said housing;

said winding cup is mounted on a shaft which is rotatable within said bushing;

reduction gearing for driving said shaft is mounted between said rib and a plate which extends transversely within said housing;

a motor driving said reduction gearing is mounted on the opposite side of said plate from said reduction gearing; and said optic fiber extends through said rib and said plate at a position radially outwardly of a rearward extension of said flange.

10. A fishing reel as defined in claim 6, wherein:

said means for receiving said optical indications is adapted to produce a readout signal showing the amount of line unwound from or wound on said reel; and means for displaying said readout of said amount of line.

* * * * *